US012261592B2

(12) United States Patent
Barsukou et al.

(10) Patent No.: US 12,261,592 B2
(45) Date of Patent: Mar. 25, 2025

(54) LAMB WAVE DELAY LINE

(71) Applicant: SKYWORKS SOLUTIONS, INC., Irvine, CA (US)

(72) Inventors: Siarhei Dmitrievich Barsukou, Takarazuka (JP); Rei Goto, Osaka (JP); Hiroyuki Nakamura, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 451 days.

(21) Appl. No.: 17/591,809

(22) Filed: Feb. 3, 2022

(65) Prior Publication Data
US 2022/0255534 A1 Aug. 11, 2022

Related U.S. Application Data

(60) Provisional application No. 63/146,244, filed on Feb. 5, 2021.

(51) Int. Cl.
H03H 9/68 (2006.01)
H03H 9/02 (2006.01)
H03H 9/145 (2006.01)
H03H 9/25 (2006.01)

(52) U.S. Cl.
CPC .......... *H03H 9/68* (2013.01); *H03H 9/02543* (2013.01); *H03H 9/145* (2013.01); *H03H 9/25* (2013.01)

(58) Field of Classification Search
CPC ...... H03H 9/68; H03H 9/02543; H03H 9/145; H03H 9/25; H03H 9/02015; H03H 9/02228; H03H 9/36
See application file for complete search history.

(56) References Cited

U.S. PATENT DOCUMENTS

2019/0334568 A1* 10/2019 Gong .................. H03H 9/74

FOREIGN PATENT DOCUMENTS

CN 1677851 A * 10/2005

OTHER PUBLICATIONS

Ansari et al., "Gallium Nitride High-Order Mode Lamb-Wave Resonators and Delay-Lines", Solid-State Sensors, Actuators and Microsystems Workshop, Hilton Head Island, South Carolina, Jun. 5-9, 2016.
Ingrosso et al., "Fabrication of AlN/Si SAW delay lines with very low RF signal noise", Microelectronic Engineering 84 (2007), 1320-1324.
Naumenko et al., "Theoretical and Experimental Investigation of Spurious Modes in a SAW Delay Line Based on Langasite", Proceedings of 2015 IEEE Ultrasonics Symposium, Taipei, Taiwan, Oct. 21-24, 2015.

(Continued)

*Primary Examiner* — Andrea Lindgren Baltzell
*Assistant Examiner* — Kimberly E Glenn
(74) *Attorney, Agent, or Firm* — Lando & Anastasi, LLP

(57) ABSTRACT

A delay line for radio frequency circuits comprises a piezoelectric substrate, a transmission single phase unidirectional transducer (SPUDT) disposed on the piezoelectric substrate, and a receive SPUDT disposed on the piezoelectric substrate and separated from the transmission SPUDT in a direction of transmission of a main acoustic wave mode utilized by the transmission SPUDT.

17 Claims, 17 Drawing Sheets

(56) References Cited

OTHER PUBLICATIONS

Qamar et al., "Solidly Mounted Anti-Symmetric Lamb-Wave Delay Lines as an Alternate to SAW Devices", IEEE Electron Device Letters, vol. 39, No. 12, Dec. 2018, pp. 1916-1919.
Wang et al., "Enhanced performance of 17.7 Ghz SAW devices based on AlN/diamond/Si layered structure with embedded nanotransducer", Applied Physics Letters 111, 253502, Dec. 2017.

* cited by examiner

LAMB WAVE DELAY LINE

CROSS-REFERENCE TO RELATED APPLICATIONS

This application claims priority under 35 U.S.C. § 119(e) to U.S. Provisional Patent Application Ser. No. 63/146,244, titled "LAMB WAVE DELAY LINE," filed Feb. 5, 2021, the entire contents of which being incorporated herein for all purposes.

BACKGROUND

Technical Field

Embodiments of this disclosure relate to delay lines incorporating acoustic wave devices and circuits and devices including same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer or a diplexer. Multiple acoustic wave filters can be connected to work as a multiplexer, which may be used for carrier aggregation (CA) in LTE Advanced.

In some devices delay lines may be provided to help synchronize electrical signals in the device. For example, if a received signal is broken into different sub-signals based on, for example, frequency, and processed separately, processing of one of the sub-signals may take longer than processing of the second. If the sub-signals are to be recombined, the second sub-signal may be passed thorough a delay line so that it is time synchronized with the first sub-signal when the sub-signals are recombined. In other implementations, a radio frequency signal may arrive at a device with a direct path signal and one or more "echoes" due to reflection off buildings or other objects. A delay line or lines can help time synchronize a direct path signal with its echoes by slowing down passage of the direct path signal to align with one or more of the echo signals prior to signal processing of the combined direct path and echo signals. Delay lines may also be utilized in circuits such as voltage-controlled oscillators, in which the delay line acts as the frequency controlling element, or echo generators, or for modulating and demodulating radio frequency signals. Simplified schematic diagrams of a voltage-controlled oscillator and an echo generator are illustrated in FIGS. 13 and 14, respectively. In FIG. 14, the "Feedback" parameter relates to an amount of the delayed signal that is added back to the original signal and effects how long the echo lasts. The Delay line adds a delay to the original signal to produce the time delayed signal. The "Dry Mix" parameter relates to an amount of the original signal passed to the output. The "Wet Mix" parameter relates to an amount of the delayed signal passed through to the output.

SUMMARY

In accordance with one aspect, there is provided a delay line for radio frequency circuits. The delay line comprises a piezoelectric substrate, a transmission single phase unidirectional transducer (SPUDT) disposed on the piezoelectric substrate, and a receive SPUDT disposed on the piezoelectric substrate and separated from the transmission SPUDT in a direction of transmission of a main acoustic wave mode utilized by the transmission SPUDT.

In some embodiments the piezoelectric substrate comprises aluminum nitride.

In some embodiments the directivity of the transmission SPUDT and the receive SPUDT is such that the transmission SPUDT and the receive SPUDT, when exited, produce main acoustic waves having greatest amplitudes travelling toward one another.

In some embodiments the transmission SPUDT and the receive SPUDT are impedance matched to a radio frequency energy source electrically coupled to the delay line.

In accordance with another aspect, there is provided a radio frequency device including the delay line. The delay line comprises a piezoelectric substrate, a transmission single phase unidirectional transducer (SPUDT) disposed on the piezoelectric substrate, and a receive SPUDT disposed on the piezoelectric substrate and separated from the transmission SPUDT in a direction of transmission of a main acoustic wave mode utilized by the transmission SPUDT.

In some embodiments the piezoelectric substrate comprises aluminum nitride.

In some embodiments the directivity of the transmission SPUDT and the receive SPUDT is such that the transmission SPUDT and the receive SPUDT, when exited, produce main acoustic waves having greatest amplitudes travelling toward one another.

In some embodiments the transmission SPUDT and the receive SPUDT are impedance matched to a radio frequency energy source electrically coupled to the delay line.

BRIEF DESCRIPTION OF THE DRAWINGS

Embodiments of this disclosure will now be described, by way of non-limiting example, with reference to the accompanying drawings.

FIG. 2B 1B is a simplified diagram of single-phase unidirectional transducer electrodes that may be used in the SAW delay line of FIG. 2A;

DETAILED DESCRIPTION OF CERTAIN EMBODIMENTS

Figure 1A:
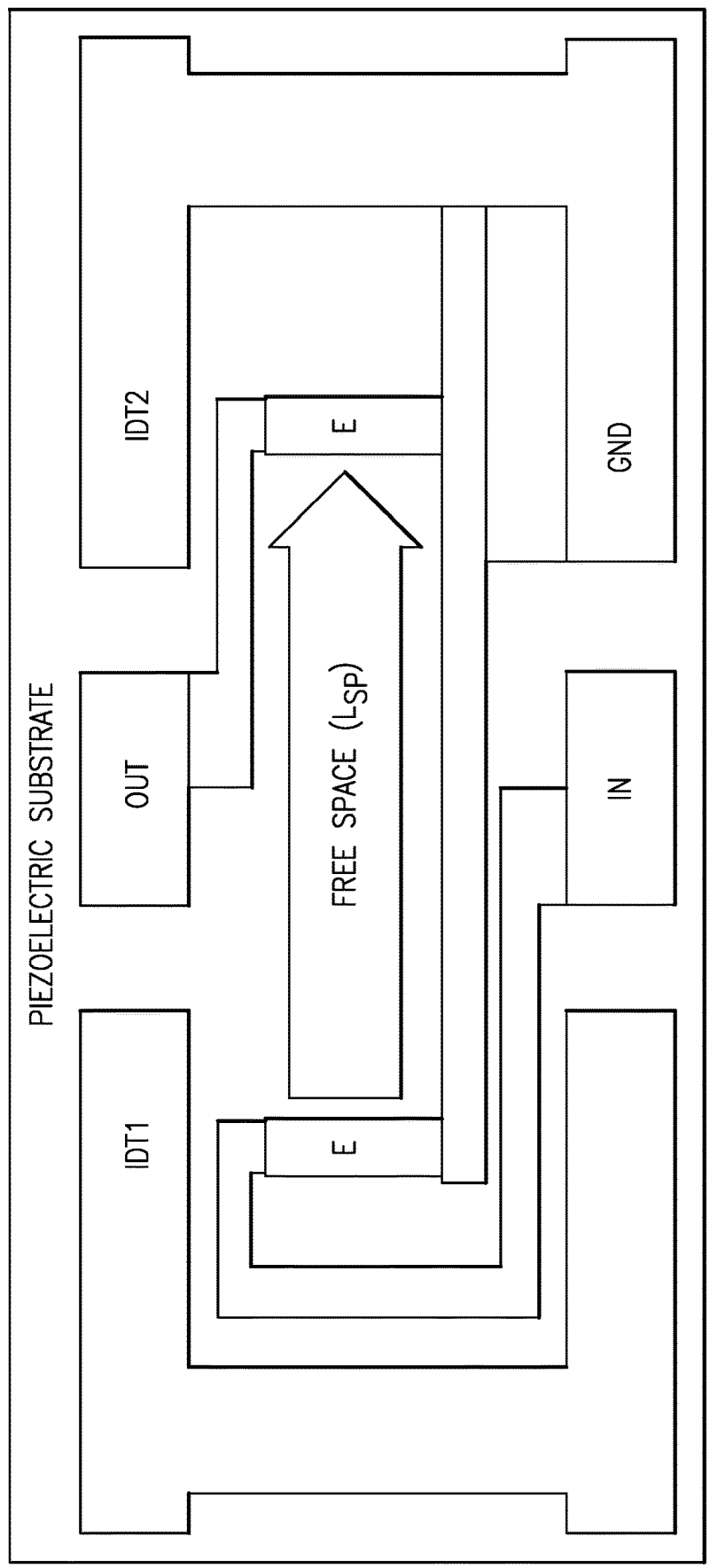
FIG. 1A is a simplified plan view of an example of a surface acoustic wave (SAW) delay line.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In some implementations, delay lines may be formed from a pair of acoustic wave transducers separated by a distance corresponding to a desired time delay.

Figure 1B:
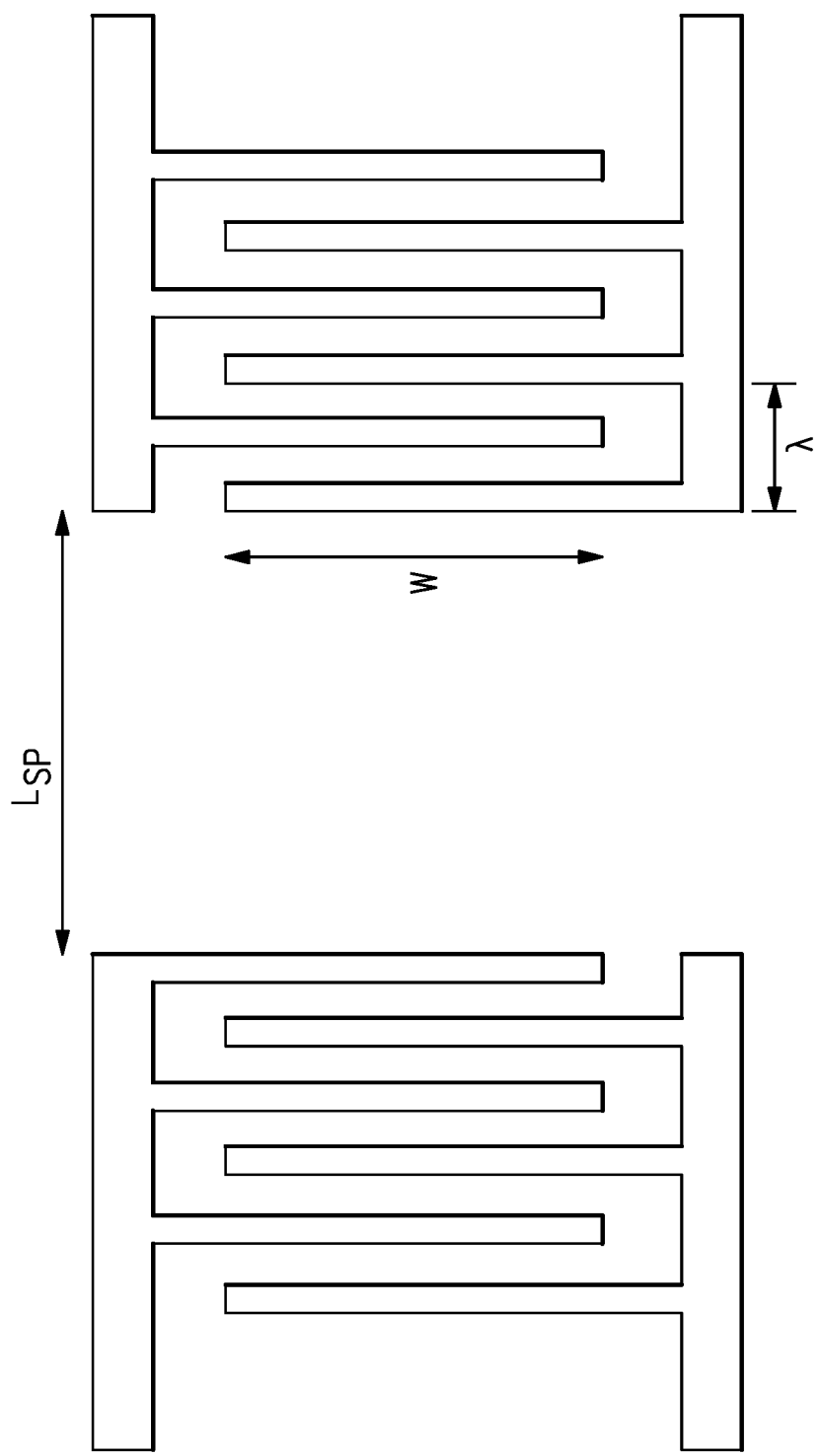
FIG. 1B is a simplified diagram of interdigital transducer electrodes that may be used in the SAW delay line of FIG. 1A.

FIG. 1A is a plan view of an example of a surface acoustic wave (SAW) delay line. In the delay line structure of FIG. 1A, an incoming electrical signal supplied to the IN terminal causes the transmitting interdigital transducer IDT1 to generate a surface acoustic wave (SAW) that travels through the substrate to the receiving interdigital transducer IDT2. The receiving interdigital transducer IDT2 generates an outgoing electrical signal from the surface acoustic wave and provides the outgoing electrical signal to the OUT terminal. The interdigital transducer (IDT) electrodes, illustrated schematically in FIG. 1B, in which W represents the electrode overlap region and λ represents the electrode finger pitch and wavelength of the main acoustic wave generated by the IDT electrodes, are located in the areas indicated "E" in FIG. 1A. IDT electrodes are known in the art and will not be described in detail herein. The SAW travels through the substrate much slower than an electrical signal would pass through a conductive trace that might be disposed between the transmitting IDT1 and receiving IDT2, so the delay line introduces a delay in propagation of the electrical signal from the IN terminal to the OUT terminal. The delay T is proportional to the distance $L_{SP}$ between the transmitting IDT1 and receiving IDT2 and may be calculated from the formula:

$$T = L_{SP}/V_F$$

where $V_F$ is the group velocity of the SAW.

The delay line structure illustrated in FIG. 1A exhibits some disadvantages. In some implementations, such a delay line may suffer from high signal distortion due to multiple reflections of the SAW and high mechanical losses. Adding reflectors to IDT1 and/or IDT2 may improve the mechanical losses but at the cost of increasing signal distortion.

Figure 2A:
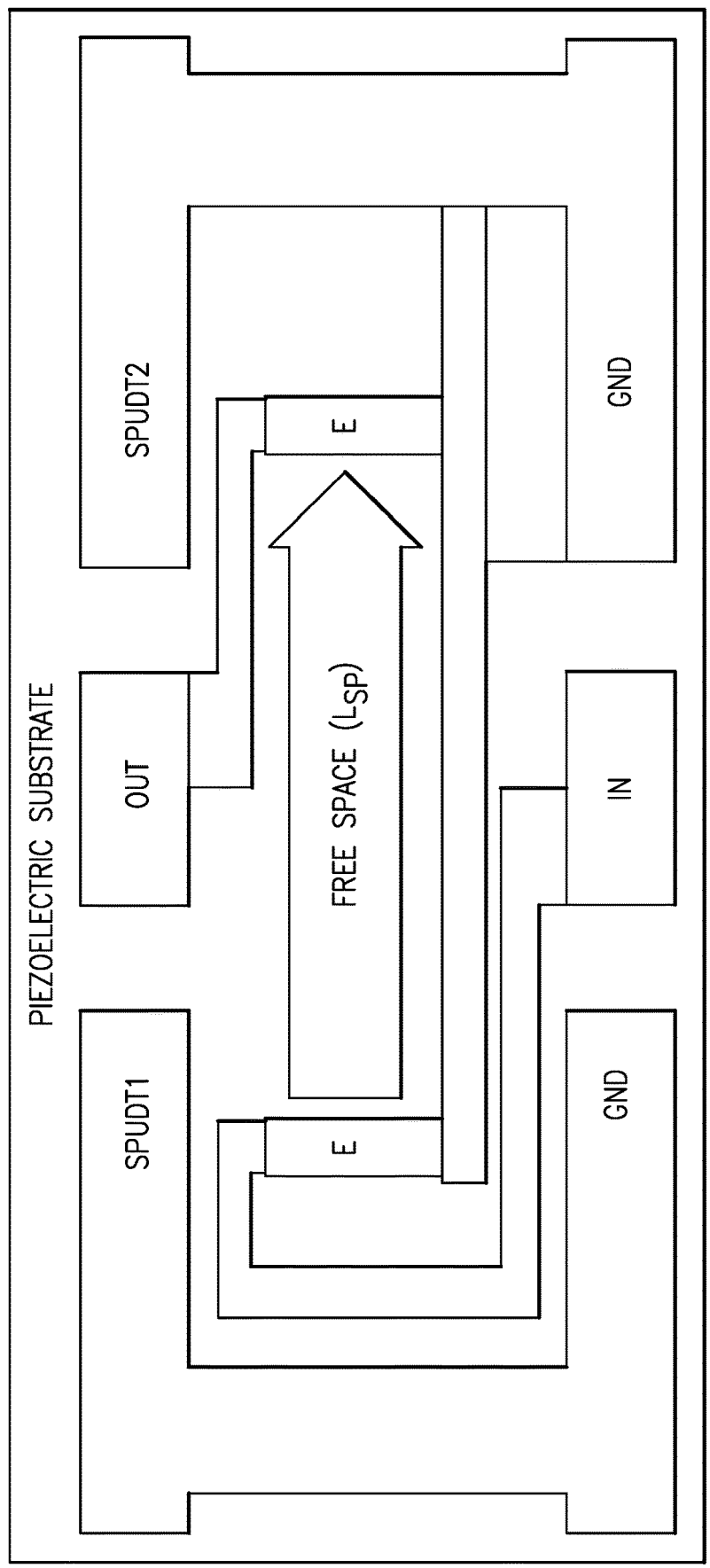
FIG. 2A is a simplified plan view of another example of a SAW delay line.
Figure 2B:
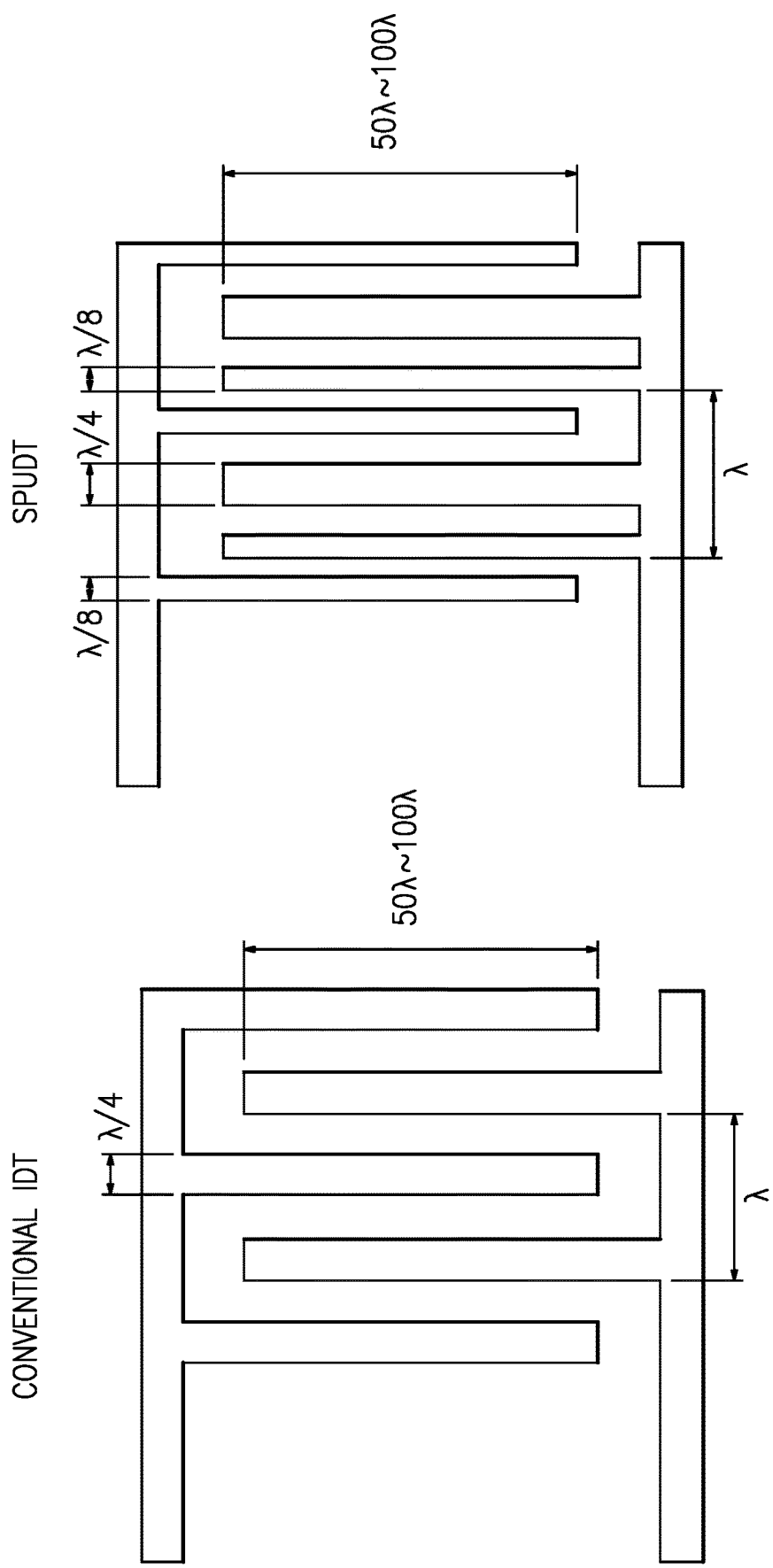

An improved SAW delay line is illustrated in FIG. 2A. The delay line of FIG. 2A may be applicable for use in fifth generation (5G) radio frequency devices, for example, cell phones with RF components, including the delay line, operating at frequencies up to 8.5 GHz or higher. Instead of utilizing conventional SAW resonators for the transmitting and receiving transducers, the improved SAW delay line utilizes single phase unidirectional transducers (SPUDT) in a regime of the S0 anti-symmetric Lamb wave generation on a thin plate waveguide to improve the total transmission losses and reduce signal distortion as compared to a delay line including IDTs, such as illustrated in FIG. 1A. The SPUDTs are located in the regions indicated "E" instead of IDT electrodes as in the delay line of FIG. 1A. A simplified schematic diagram of a SPUDT electrode compared to a conventional IDT electrode is illustrated in FIG. 2B. The SPUDT electrode may include thinner electrode fingers (finger width=λ/8) extending from each bus bar than the IDT electrode (finger width=λ/4) as well as additional thicker electrode fingers (finger width=λ/4) extending from one of the busbars. In the SPUDT electrode one thin electrode finger and one thicker electrode finger extend from one busbar between adjacent electrode fingers extending from the other bus bar.

Figure 3:
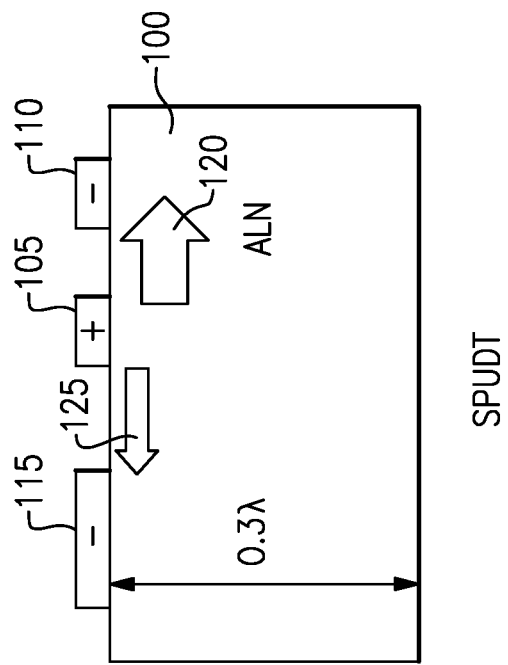
FIG. 3 illustrates partial cross-sectional views of different types of transducers that may be used in a SAW delay line.
Figure 3:
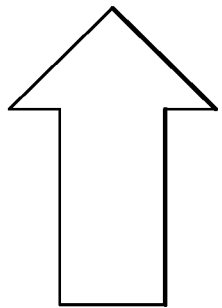
Figure 3:
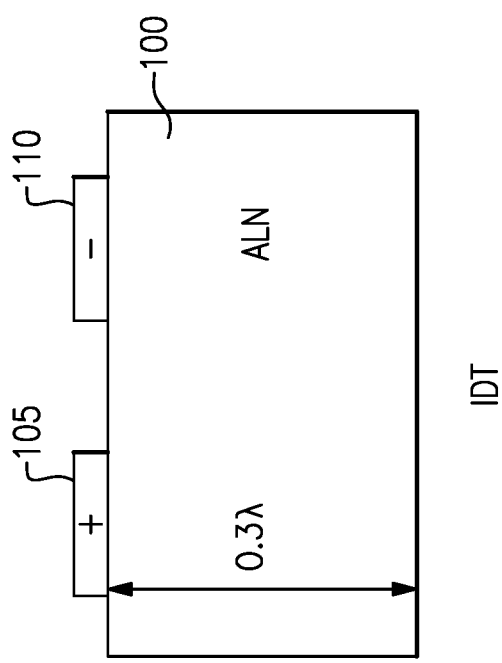

FIG. 3 further illustrates differences between a conventional SAW transducer such as might be used in the delay line of FIG. 1A and a SPUDT as might be used in the delay line of FIG. 2A. Only a portion of the transducers are shown in cross-section in FIG. 3. In the IDT, an interleaved set of electrode fingers 105, 110 are disposed on a piezoelectric substrate 100, for example aluminum nitride (AlN). In the SPUDT, an additional wider electrode finger 115 is added on one side of the interleaved set of electrode fingers 105, 110. Both the electrode fingers 110 and 115 may extend from the same busbar and be disposed between adjacent electrode fingers 105 that extend from the opposite busbar, as is illustrated in FIG. 2B. The additional electrode finger 115 increases the strength of a signal 120 travelling away from the electrode fingers 105, 110 in a direction opposite to a side of the electrode fingers 105, 110 on which the additional electrode finger 115 is disposed, for example, from SPUDT1 to SPUDT2 in the delay line of FIG. 2A, while reducing the strength of a signal 125 travelling in a direction from the electrode fingers 105, 110 toward the additional electrode finger 115. The reduction in signal amplitude of the signal 125 travelling in the direction from the electrode fingers 105, 110 toward the additional electrode finger 115 reduces the magnitude of any reflections that might be caused by this signal and that might degrade the delay line transmission of the delay line. It should be appreciated that other substrates may be used for these transducers, for example, a lithium tantalate (LiTaO$_3$) or lithium niobate (LiNbO$_3$) substrate or a multi-layer substrate including AlN/diamond/Si layers or AlN/Mo/Si layers.

In some embodiments of SPUDT transducers utilized in delay lines as disclosed herein, the substrate 100 may have a thickness of between about 0.1λ and 1.0λ, where λ is a wavelength of a main acoustic wave generated by the transducers. The electrode fingers 105, 110, 115 may be made of Al with a thickness of between about 0.01λ and about 0.1λ. In other embodiments, the electrode fingers may include multiple layers, for example, Al disposed on Mo or W, with the thicknesses of the layers determined based on design goals. These dimensions and materials are only examples and different implementations may be formed with different dimensions or materials as desired to satisfy particular design or performance goals.

Figure 4:
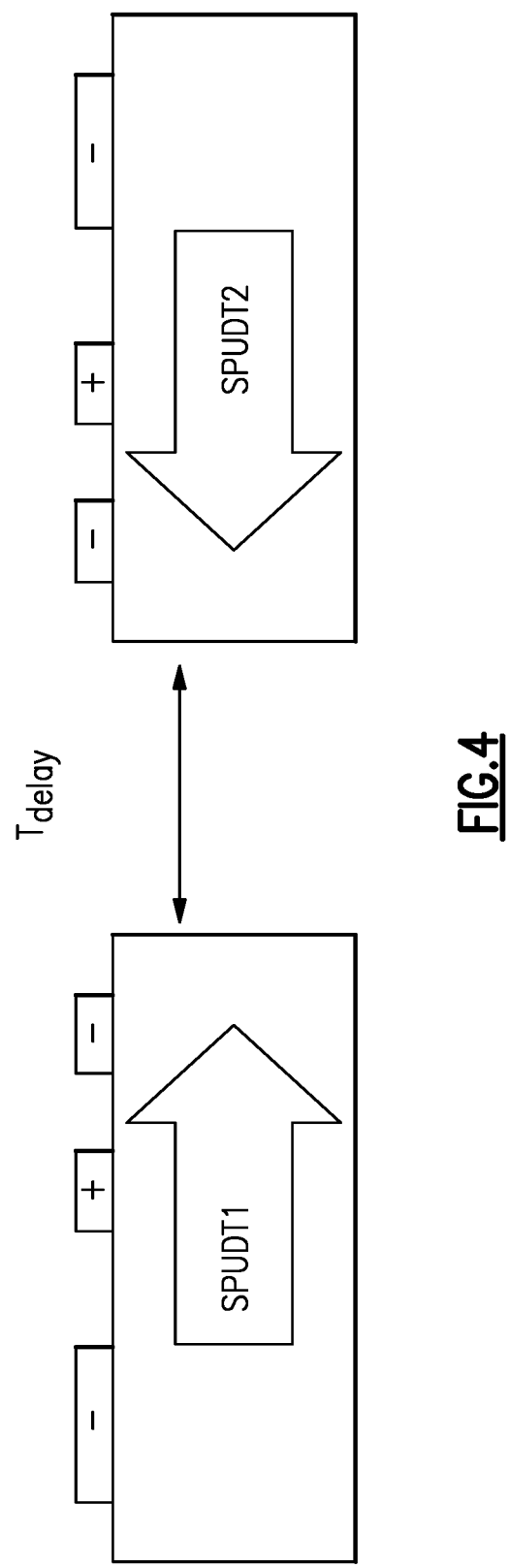
FIG. 4 illustrates the directionality of main acoustic waves produced by examples of transducers in a SAW delay line.

The combination of SPUDT1 and SPUDT2 in a device such as the delay line of FIG. 2A and the direction of the main acoustic wave generated by these transducers, indicated by arrows, is illustrated in FIG. 4. The separation between SPUDT1 and SPUDT2 causes the delay line to introduce a delay time of $T_{delay}$ to a signal passing through the delay line.

Figure 5:
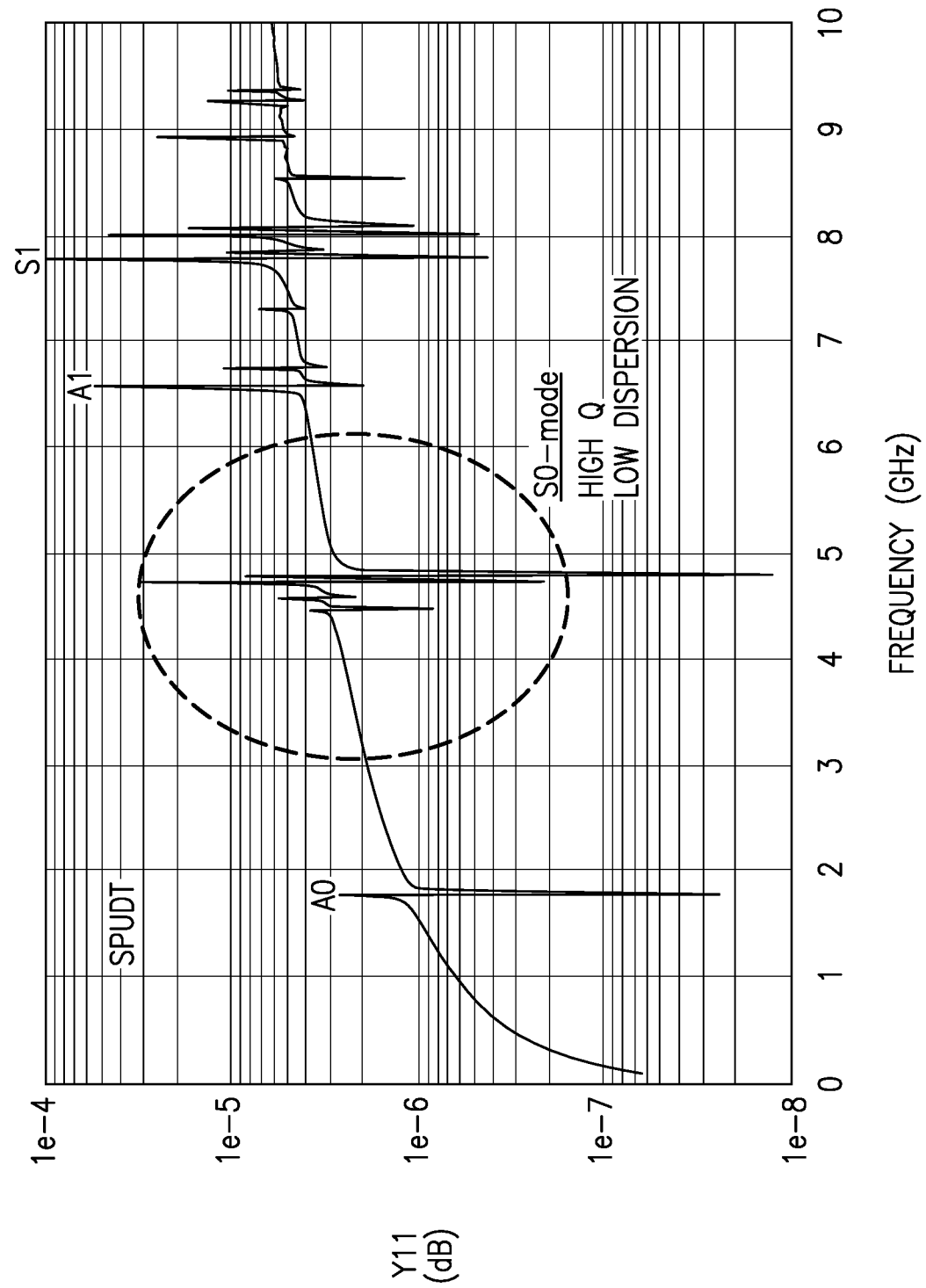
FIG. 5 illustrates results of a simulation of insertion loss as a function of frequency as well as the frequency at which different SAW propagation modes occur in an example of a transducer for a SAW delay line.

FIG. 5 illustrates the impedance parameter Y11 of a signal generated by a SPUDT as disclosed herein as a function of frequency. The main S0 anti-symmetric Lamb wave propagation mode is illustrated as well as the A0, A1, and S1 propagation modes. As shown in FIG. 5, the SPUDT shows good performance at the high order Lamb wave generation regime. The distortion of the registered signal in a delay line utilizing the SPUDTs as illustrated in FIG. 2A is reduced due to the transmittance direction of the SPUDTs turned toward each other. The improvement in insertion loss of the registered signal may be a result of the directivity of the SAW wave propagation and due to the resulting improved acoustic wave guiding resulting from reduced leakage because of the SAW waves being directed primarily from one SPUDT to the other SPUDT and not from one SPUDT in a direction away from the other SPUDT.

Figure 6:
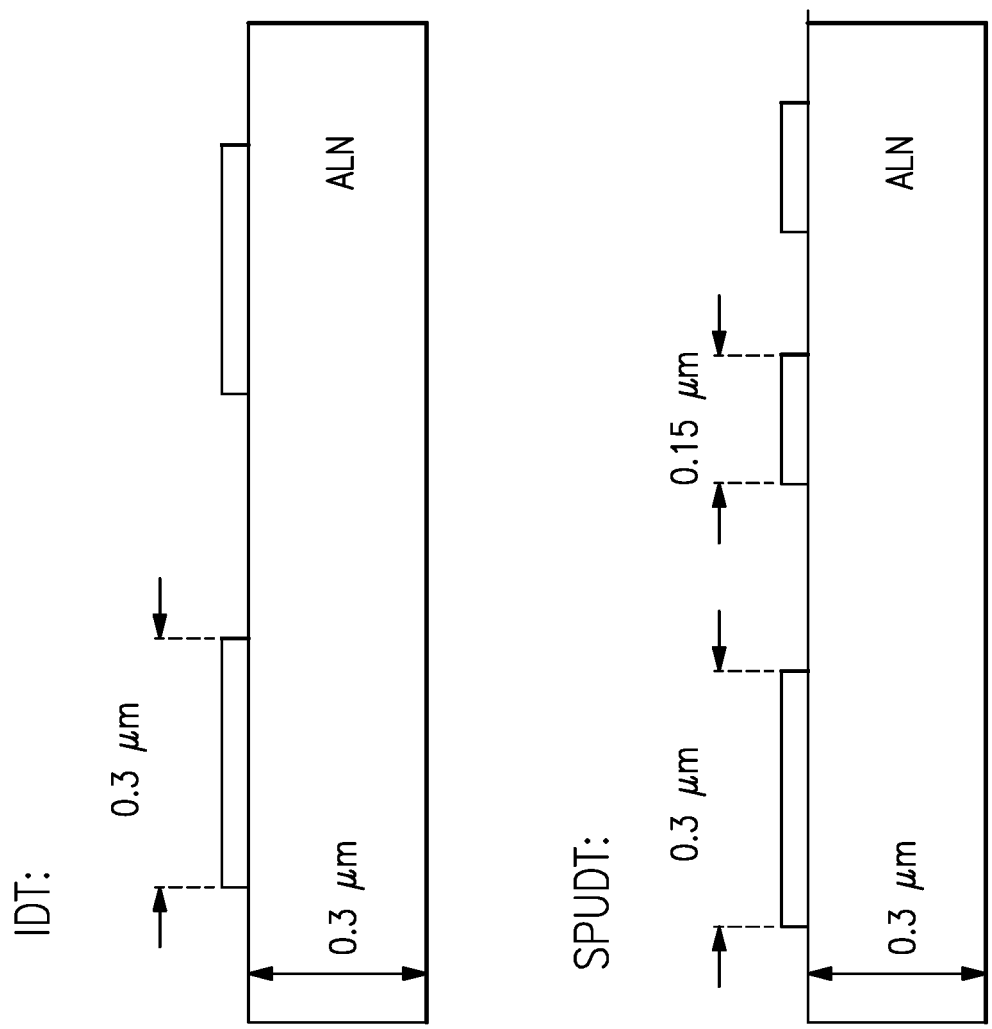
FIG. 6 illustrates the dimensions of different transducers used in simulations of a SAW delay line.
Figure 7:
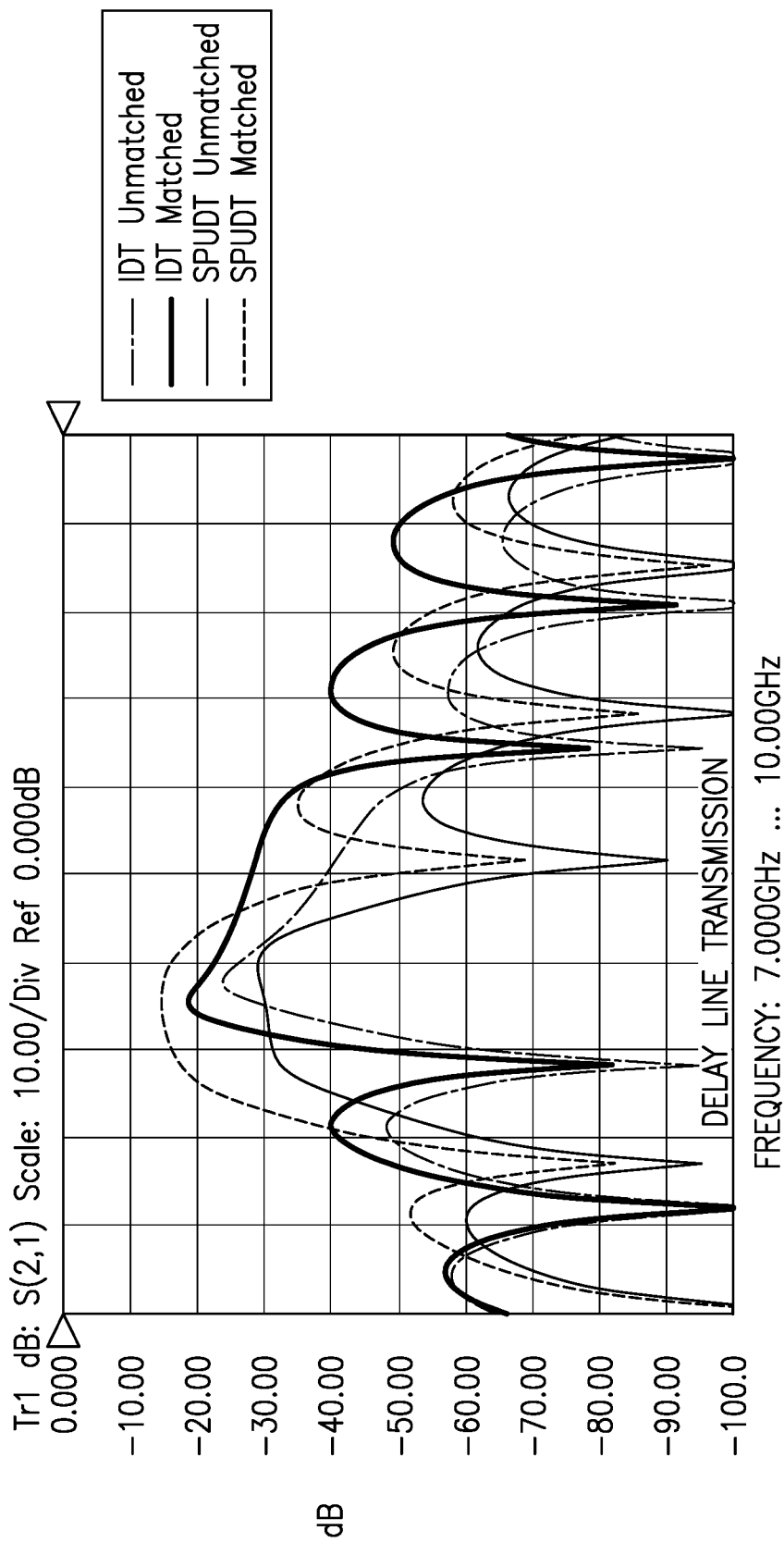
FIG. 7 illustrates results of a simulation of insertion loss as a function of frequency for different types of matched and unmatched transducers in a SAW delay line.
Figure 8:
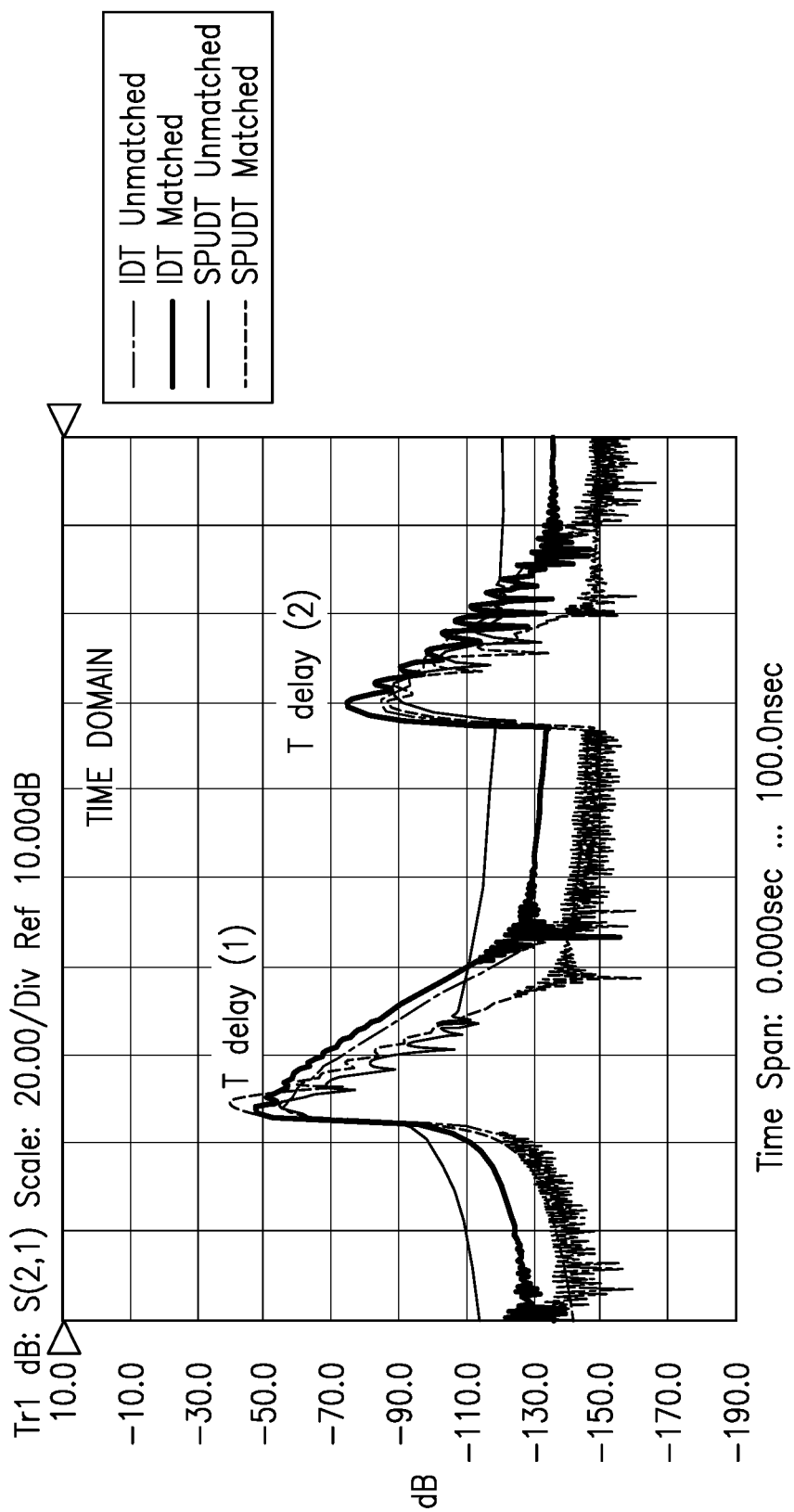
FIG. 8 illustrates results of a simulation of insertion loss in the time domain for different types of matched and unmatched transducers in a SAW delay line.
Figure 9A:
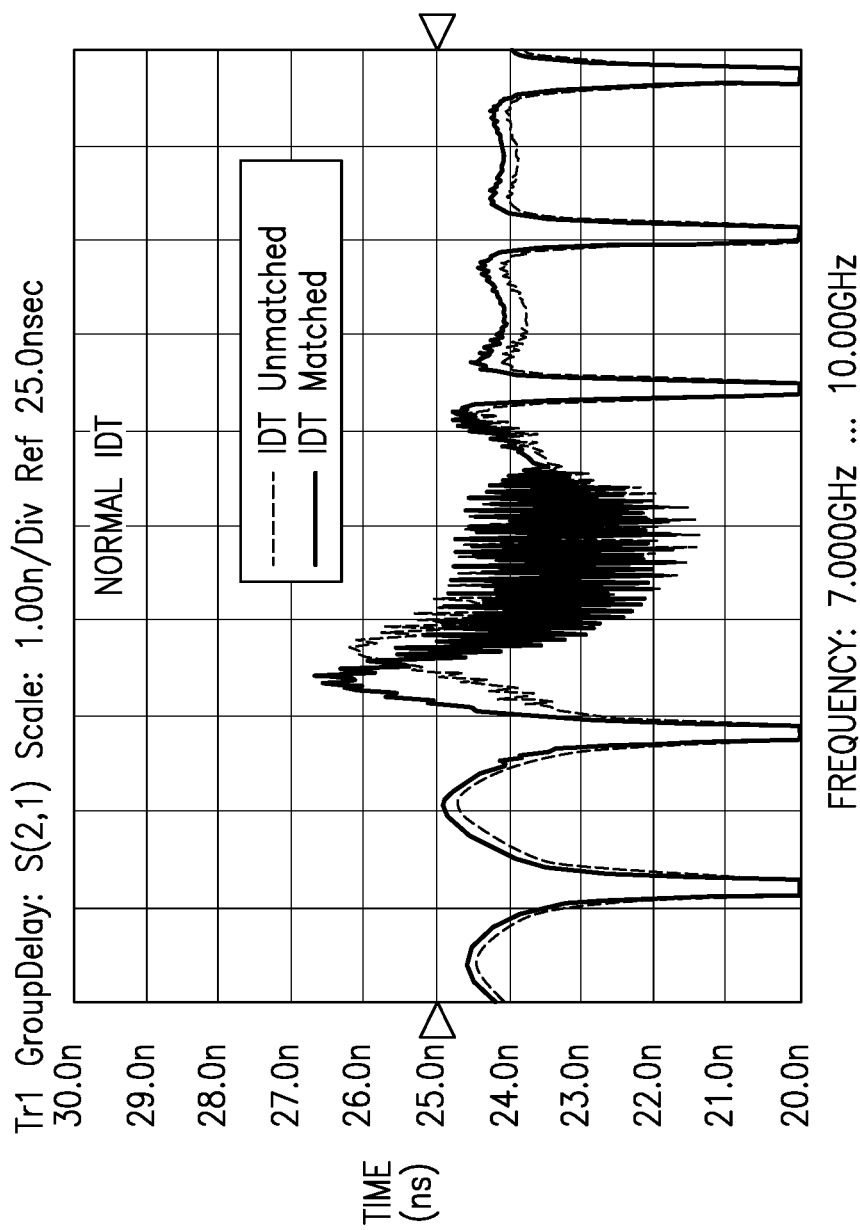
FIG. 9A illustrates results of a simulation comparing group delay for matched and unmatched transducers in a SAW delay line using one type of transducer.
Figure 9B:
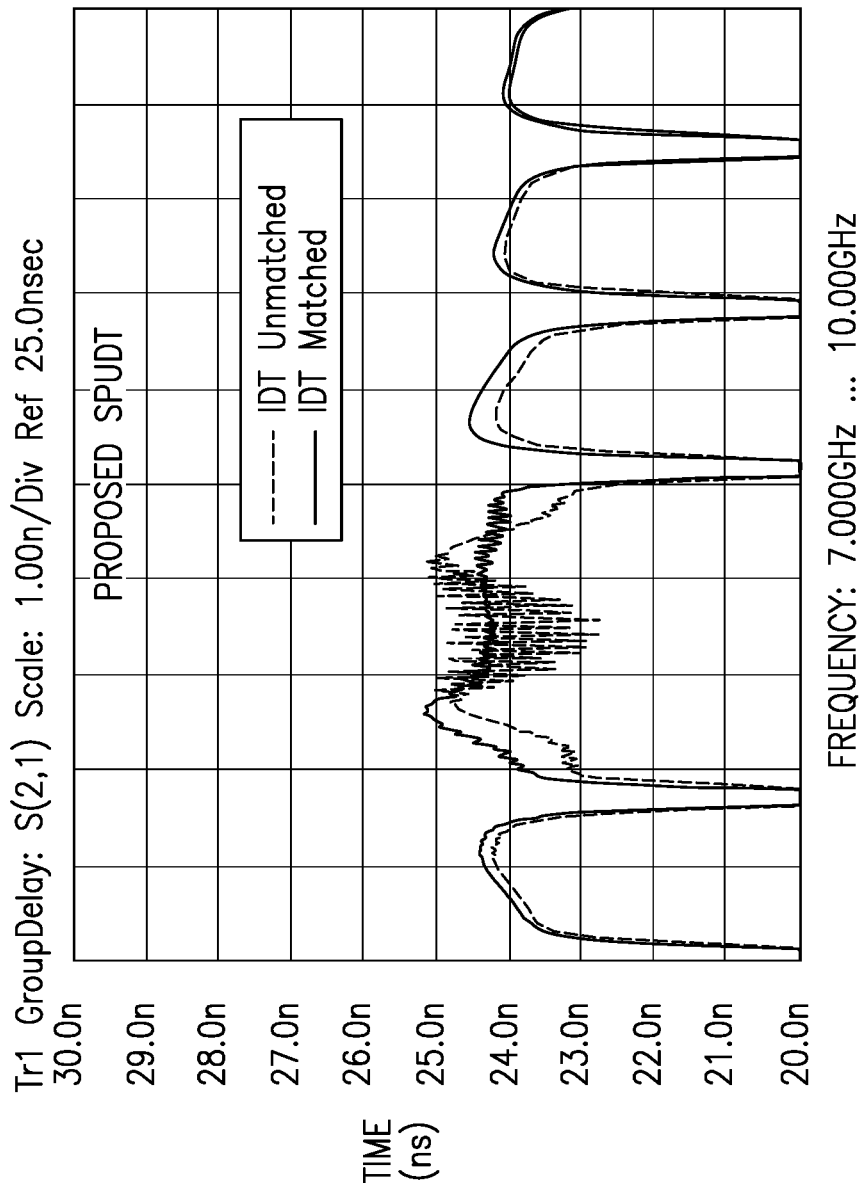
FIG. 9B illustrates results of a simulation comparing group delay for matched and unmatched transducers in a SAW delay line using a second type of transducer.

Simulations were performed to compare the performance of delay lines having IDT and SPUDT structures that were either impedance matched with a radio frequency (RF) energy signal source or impedance mismatched with the RF energy signal source. The simulated model assumed a wavelength of the main acoustic wave λ generated by the transducers to be 1.2 μm, the number of electrode fingers in the transducers to be 16, and the waveguide length $L_{SP}$ to be 180λ. The dimensions of the electrode fingers for the IDTs and SPUDTs were as illustrated in FIG. 6. The results of delay line transmission simulation are illustrated in the chart of FIG. 7. From this chart it can be seen that the delay line transmission parameter was best with the matched SPUDT configuration. Delay line transmission in the time domain is illustrated in the chart of FIG. 8. T delay (1) in this figure represents the mean time for the main mode surface acoustic wave to propagate from the transmitter SPUDT1 to the receiver SPUDT2. T delay (2) represent the mean time for another acoustic wave mode with a different wave front and velocity that propagates simultaneously with the main mode acoustic wave to propagate from the transmitter SPUDT1 to the receiver SPUDT2. It can again be seen in FIG. 8 that the matched SPUDT delay line configuration illustrated reduced transmission loss as well as reduced signal interference as compared to the other configurations. The SAW group delays for the IDT-based delay line and for the SPUDT-based delay line as a function of frequency are shown in FIGS. 9A and 9B, respectively. From FIGS. 9A and 9B it can be seen that the matched SPUDT configuration illustrated reduced signal distortion as compared to the other configurations.

Figure 10:
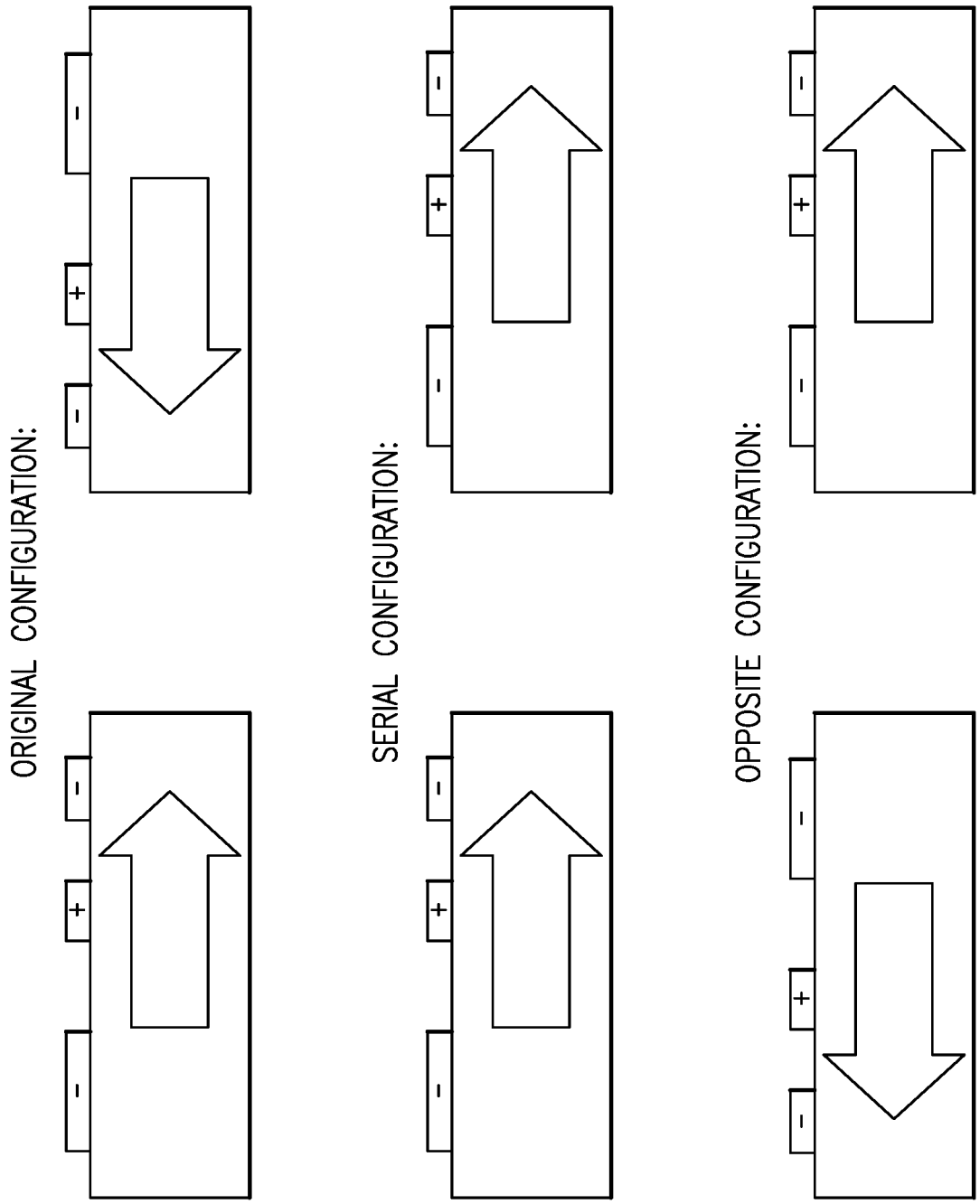
FIG. 10 illustrates different types of directionality for transducers in a delay line.

Simulations were performed to determine the effect on insertion loss of SPUDT directivity in a delay line as illustrated in FIG. 2A. Three types of directivity were examined. These directivity types are illustrated in FIG. 10. A first directivity type is referred to as "original configuration." In this directivity type, the two SPUDTs in a delay line, when excited, produce main acoustic waves having greatest amplitudes travelling toward one another. In a second "serial configuration" directivity type, the two SPUDTs in a delay line, when excited, produce main acoustic waves having greatest amplitudes travelling in the same direction. In a third "opposite configuration" directivity type, the two SPUDTs in a delay line, when excited, produce main acoustic waves having greatest amplitudes travelling away from one another. For the purposes of the simulation, the SPUDTs were modeled to generate a main acoustic wave with a wavelength λ of 1.2 μm. The SPUDTs were further modeled as having an AlN substrate thickness of 0.3 μm, an Al electrode thickness (height) of 30 nm, a distance between SPUDTs $L_{SP}$ of 108λ, and 15 IDT fingers each.

Figure 11:
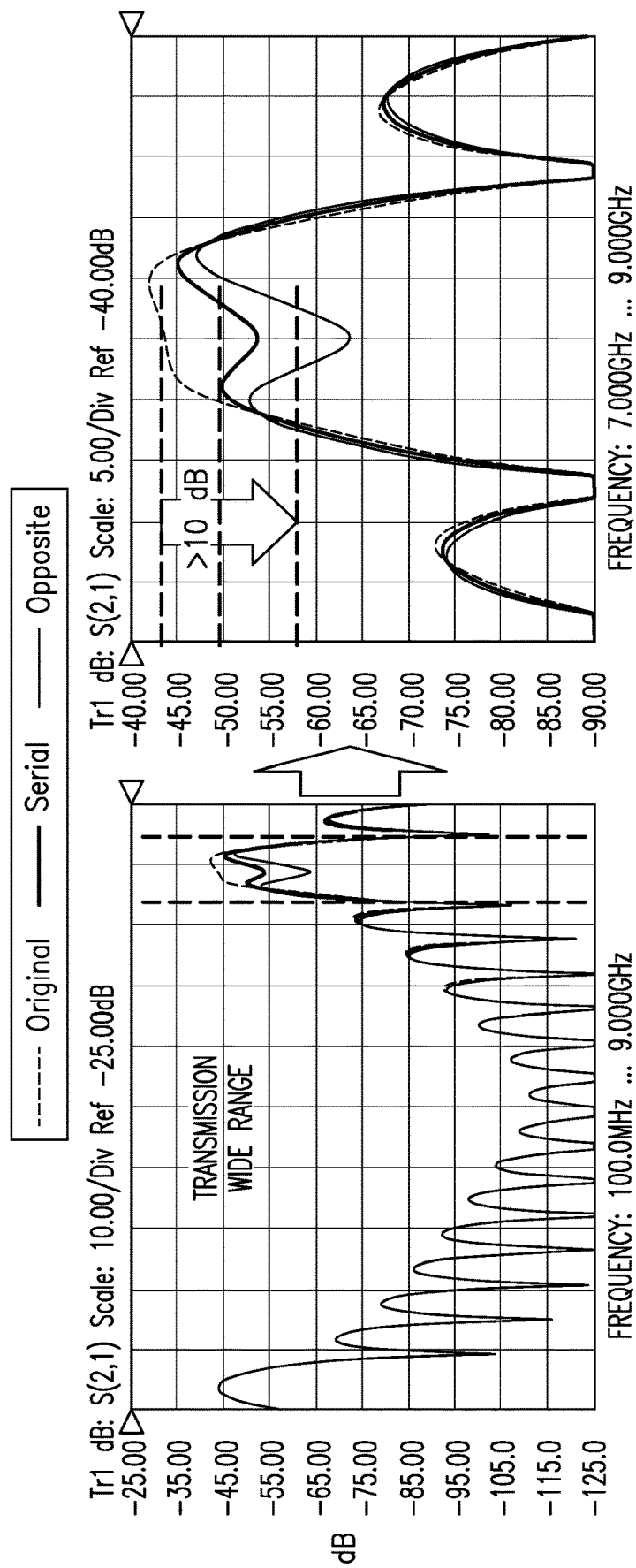
FIG. 11 illustrates results of a simulation of transmission loss as a function of frequency for different types transducer directionality in a SAW delay line.

The effect of the different directivity types on transmission loss is illustrated in FIG. 11. As shown, the "original configuration" directivity type exhibited the least transmission loss and the "opposite configuration" directivity type exhibited the greatest insertion loss.

Figure 12:
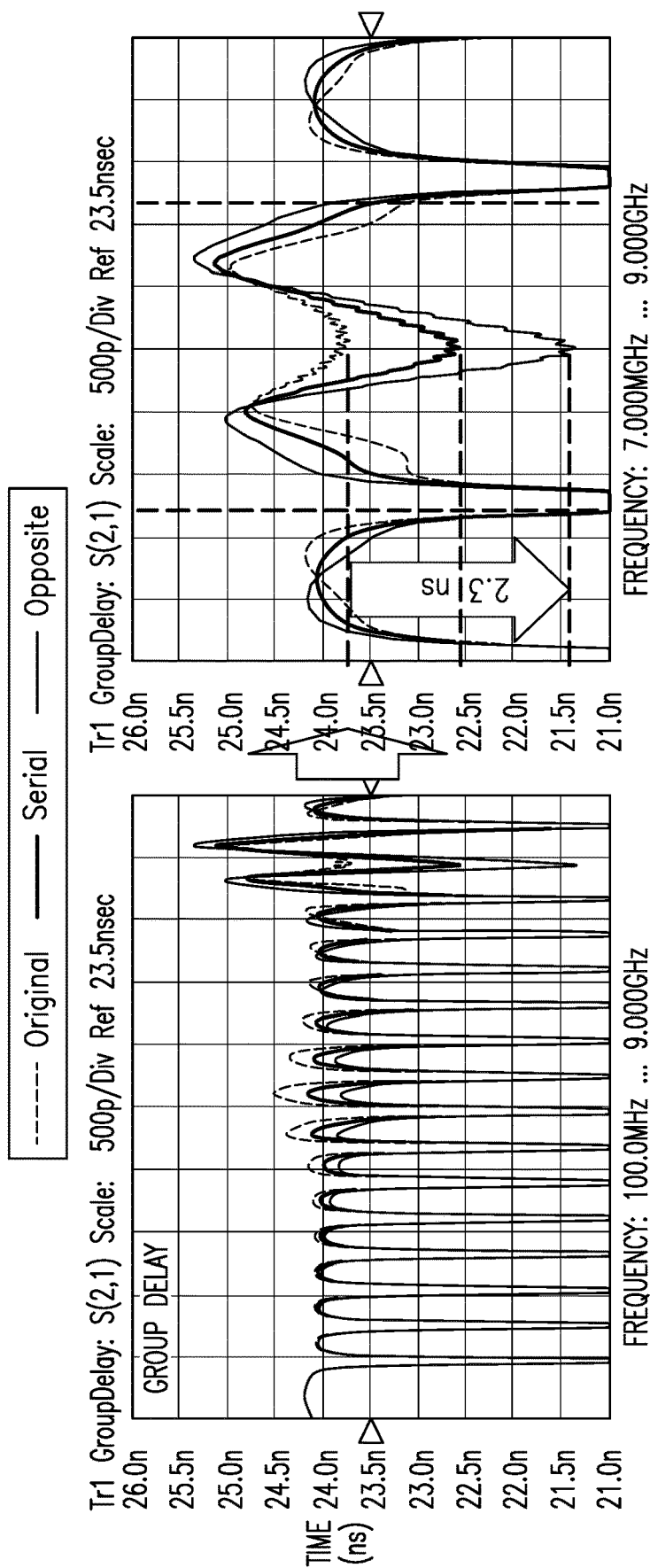
FIG. 12 illustrates results of a simulation of group delay as a function of frequency for different types of transducer directionality in a SAW delay line.
Figure 13:
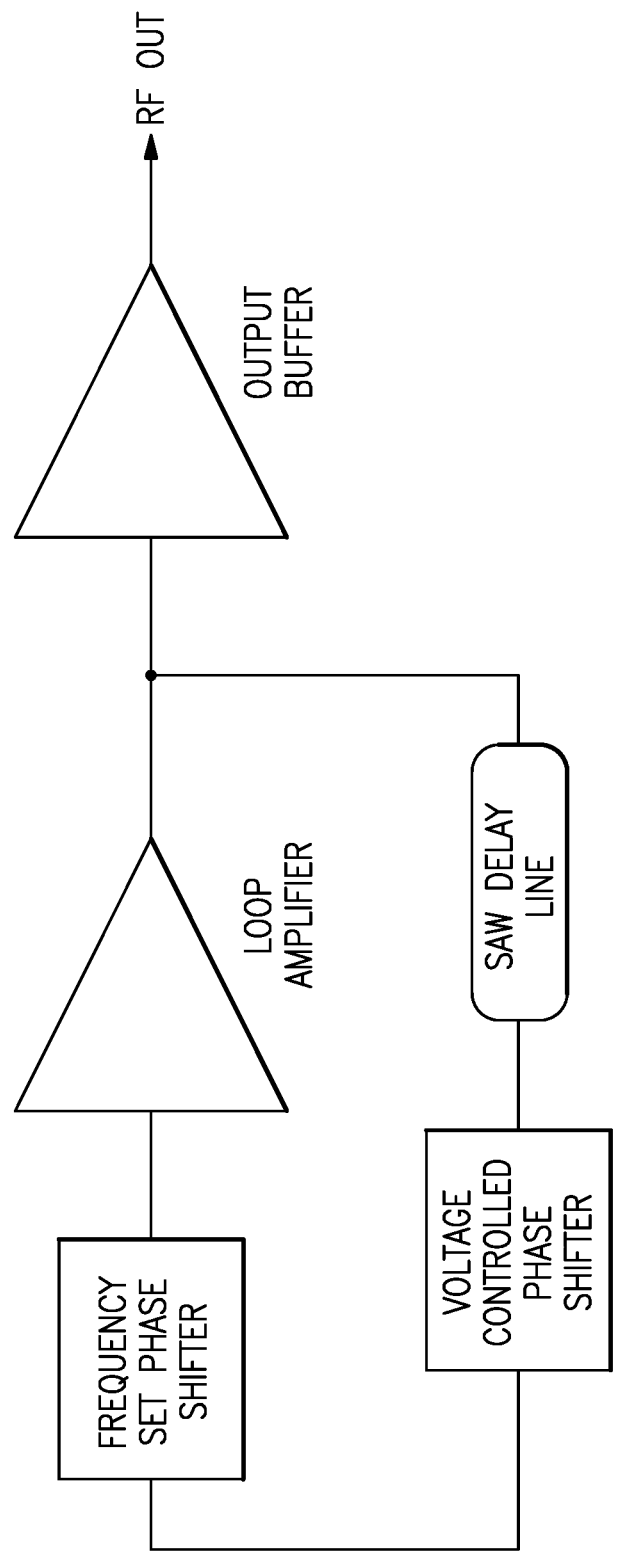
FIG. 13 is a simplified schematic diagram of a voltage-controlled oscillator.
Figure 14:
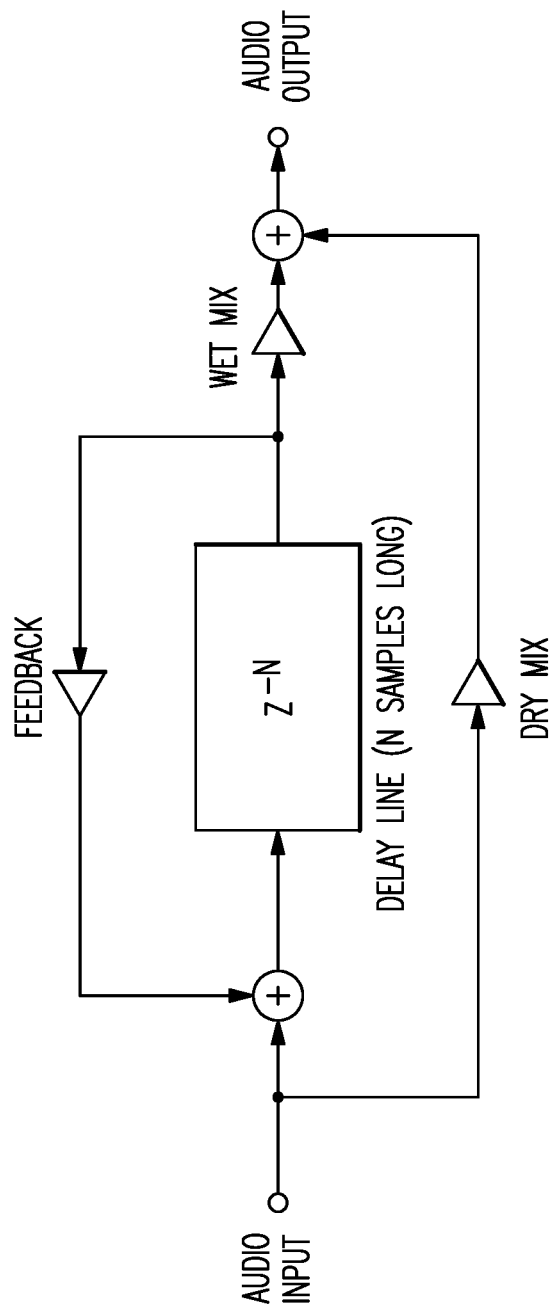
FIG. 14 is a simplified schematic diagram of an echo generator.

The effect of the different directivity types on group delay versus frequency is illustrated in FIG. 12. As shown, the "original configuration" directivity type exhibited the highest group delay, especially at high frequencies from about 7 GHz to about 9 GHz and the "opposite configuration" directivity type exhibited the shortest group delay. The "original configuration" directivity type exhibited a lesser degree of discontinuities in the group delay curves with the "opposite configuration" directivity type exhibited the greatest degree of discontinuities in these curves.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word:

any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A delay line for radio frequency circuits, the delay line comprising:
   a piezoelectric substrate;
   a transmission single phase unidirectional transducer (SPUDT) disposed on the piezoelectric substrate; and
   a receive SPUDT disposed on the piezoelectric substrate and separated from the transmission SPUDT in a direction of transmission of a main acoustic wave mode utilized by the transmission SPUDT, directivity of the transmission SPUDT and the receive SPUDT being such that the transmission SPUDT and the receive SPUDT, when excited, produce main acoustic waves having greatest amplitudes travelling toward one another.

2. The delay line of claim 1 wherein the piezoelectric substrate comprises aluminum nitride.

3. The delay line of claim 1 wherein the transmission SPUDT and the receive SPUDT are impedance matched to a radio frequency energy source electrically coupled to the delay line.

4. A radio frequency device including a delay line comprising:
   a piezoelectric substrate;
   a transmission single phase unidirectional transducer (SPUDT) disposed on the piezoelectric substrate; and
   a receive SPUDT disposed on the piezoelectric substrate and separated from the transmission SPUDT in a direction of transmission of a main acoustic wave mode utilized by the transmission SPUDT, directivity of the transmission SPUDT and the receive SPUDT being such that the transmission SPUDT and the receive SPUDT, when excited, produce main acoustic waves having greatest amplitudes travelling toward one another.

5. The radio frequency device of claim 4 wherein the piezoelectric substrate comprises aluminum nitride.

6. The radio frequency device of claim 4 wherein the transmission SPUDT and the receive SPUDT are impedance matched to a radio frequency energy source electrically coupled to the delay line.

7. The delay line of claim 1 wherein at least one of the transmission SPUDT or the receive SPUDT includes interdigital transducer electrodes formed of aluminum.

8. The delay line of claim 7 wherein the interdigital transducer electrodes have thicknesses of between $0.01\lambda$ and $0.1$, $\lambda$ being a wavelength of a main acoustic wave generated by the at least one of the transmission SPUDT or the receive SPUDT.

9. The delay line of claim 1 wherein at least one of the transmission SPUDT or the receive SPUDT includes interdigital transducer electrodes having a first bus bar and a second bus bar and interdigitated electrode fingers extending from each of the first bus bar and the second bus bar, one thinner electrode finger and one thicker electrode finger extending from the first bus bar between adjacent electrode fingers extending from the second bus bar.

10. The delay line of claim 9 wherein the thinner electrode finger has a width of $\lambda/4$ and the thinner electrode finger has a width of $\lambda/8$, $\lambda$ being a wavelength of a main acoustic wave generated by the at least one of the transmission SPUDT or the receive SPUDT.

11. The delay line of claim 1 wherein the piezoelectric substrate of at least one of the transmission SPUDT or the receive SPUDT has a thickness of between $0.1\lambda$ and $1.0\lambda$, , $\lambda$ being a wavelength of a main acoustic wave generated by the at least one of the transmission SPUDT or the receive SPUDT.

12. A delay line for radio frequency circuits, the delay line comprising:
    a piezoelectric substrate;
    a transmission single phase unidirectional transducer (SPUDT) disposed on the piezoelectric substrate; and
    a receive SPUDT disposed on the piezoelectric substrate and separated from the transmission SPUDT in a direction of transmission of a main acoustic wave mode utilized by the transmission SPUDT, the transmission SPUDT and the receive SPUDT being impedance matched to a radio frequency energy source electrically coupled to the delay line.

13. The delay line of claim 12 wherein the piezoelectric substrate comprises aluminum nitride.

14. The delay line of claim 12 wherein at least one of the transmission SPUDT or the receive SPUDT includes interdigital transducer electrodes formed of aluminum.

15. A radio frequency device including a delay line comprising:
    a piezoelectric substrate;
    a transmission single phase unidirectional transducer (SPUDT) disposed on the piezoelectric substrate; and
    a receive SPUDT disposed on the piezoelectric substrate and separated from the transmission SPUDT in a direction of transmission of a main acoustic wave mode utilized by the transmission SPUDT, the transmission SPUDT and the receive SPUDT being impedance matched to a radio frequency energy source electrically coupled to the delay line.

16. The radio frequency device of claim 15 wherein the piezoelectric substrate comprises aluminum nitride.

17. The radio frequency device of claim 15 wherein at least one of the transmission SPUDT or the receive SPUDT includes interdigital transducer electrodes formed of aluminum.

* * * * *

UNITED STATES PATENT AND TRADEMARK OFFICE
CERTIFICATE OF CORRECTION

| | |
|---|---|
| PATENT NO. | : 12,261,592 B2 |
| APPLICATION NO. | : 17/591809 |
| DATED | : March 25, 2025 |
| INVENTOR(S) | : Siarhei Dmitrievich Barsukou et al. |

Page 1 of 1

It is certified that error appears in the above-identified patent and that said Letters Patent is hereby corrected as shown below:

In the Claims

Column 8, Line 16, Claim 8, delete "0.1" and insert -- 0.1λ --

Signed and Sealed this
Twenty-second Day of April, 2025

Coke Morgan Stewart
*Acting Director of the United States Patent and Trademark Office*